(12) United States Patent
Hsu et al.

(10) Patent No.: US 11,189,660 B2
(45) Date of Patent: Nov. 30, 2021

(54) NON-VOLATILE MEMORY AND METHOD OF FABRICATING THE SAME

(71) Applicant: Winbond Electronics Corp., Taichung (TW)

(72) Inventors: Po-Yen Hsu, Taichung (TW); Bo-Lun Wu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 76 days.

(21) Appl. No.: 16/823,344

(22) Filed: Mar. 19, 2020

(65) Prior Publication Data
US 2021/0083006 A1 Mar. 18, 2021

(30) Foreign Application Priority Data

Sep. 17, 2019 (TW) .................................. 108133420

(51) Int. Cl.
*H01L 27/24* (2006.01)
*H01L 27/11543* (2017.01)
*G06F 3/06* (2006.01)

(52) U.S. Cl.
CPC .... *H01L 27/2418* (2013.01); *H01L 27/11543* (2013.01); *G06F 3/0688* (2013.01)

(58) Field of Classification Search
CPC ........... H01L 27/2418; H01L 27/11543; H01L 45/165; H01L 45/1683; H01L 45/146; H01L 45/1233; G06F 3/0688
See application file for complete search history.

(56) References Cited

U.S. PATENT DOCUMENTS

| 5,554,565 A | 9/1996 | Liaw et al. |
| 6,960,512 B2 | 11/2005 | Cheng et al. |
| 9,583,701 B1 | 2/2017 | Gee et al. |
| 2016/0005963 A1* | 1/2016 | Kim ...................... G06F 3/0679 710/57 |
| 2018/0012652 A1 | 1/2018 | Yang et al. |
| 2020/0066984 A1* | 2/2020 | Liu ................... H01L 27/11524 |

FOREIGN PATENT DOCUMENTS

TW 200901376 1/2009

OTHER PUBLICATIONS

"Office Action of Taiwan Counterpart Application", dated May 6, 2020, p. 1-p. 6.

* cited by examiner

*Primary Examiner* — Jerome Leboeuf
(74) *Attorney, Agent, or Firm* — JCIPRNET

(57) ABSTRACT

Provided is a non-volatile memory including a conductor layer, a memory device, and a selector. The selector is located between and electrically connected to the memory device and the conductive layer. The selector includes a metal filling layer, a barrier layer, and a rectify layer. The metal filling layer is electrically connected to the memory device. The barrier layer is located on the sidewall and the bottom surface of the metal filling layer. The rectify layer is wrapped around the barrier layer. The rectify layer includes a first portion and a second portion. The first portion is located between the barrier layer on the bottom surface of the metal filling layer and the conductive layer. The second portion and the metal filling layer sandwich the barrier layer on the sidewall of the metal filling layer. The first portion has more diffusion paths of metal ions than the second portion.

10 Claims, 7 Drawing Sheets

NON-VOLATILE MEMORY AND METHOD OF FABRICATING THE SAME

CROSS-REFERENCE TO RELATED APPLICATION

This application claims the priority benefit of Taiwan application serial no. 108133420, filed on Sep. 17, 2019. The entirety of the above-mentioned patent application is hereby incorporated by reference herein and made a part of this specification.

BACKGROUND

Technical Field

The disclosure relates to a memory and a method of fabricating the same, and more particularly to a non-volatile memory including a selector and a method of fabricating the same.

Description of Related Art

In recent years, the development of the resistive random access memory (RRAM), the phase change memory (PCM), or the magnetic random access memory (MRAM) has been extremely fast, and they are currently the most popular non-volatile memories. These memories are suitable as the next-generation non-volatile memory devices since they have the potential advantages of low power consumption, high-speed operation, high density, high durability, long storage time, and compatibility with the process technology of the complementary metal oxide semiconductor (CMOS). However, in a one transistor and multi-resistance (1TnR) configuration, such as a one-transistor and two-resistance (1T2R) configuration, the issue of misjudgment caused by the sneak current and issues such as SET disturb due to the high density of the memory devices need to be solved.

SUMMARY

The disclosure provides a non-volatile memory that avoids issues such as generation of a sneak current and SET disturb of a one-transistor and multi-resistance (1TnR) device.

An embodiment of the disclosure provides a non-volatile memory including a conductor layer, a memory device, and a selector. The selector is located between and electrically connected to the memory device and the conductive layer. The selector includes a metal filling layer, a barrier layer, and a rectify layer. The metal filling layer is electrically connected to the memory device. The barrier layer is located on a sidewall and a bottom surface of the metal filling layer. The rectify layer is wrapped around the barrier layer. The rectify layer includes a first portion and a second portion. The first portion is located between the barrier layer on the bottom surface of the metal filling layer and the conductive layer. The second portion and the metal filling layer sandwich the barrier layer on the sidewall of the metal filling layer. The first portion has more diffusion paths of metal ions than the second portion.

An embodiment of the disclosure provides a method of fabricating a non-volatile memory, including forming a dielectric layer on a conductor layer. An opening is formed in the dielectric layer. A selector is formed in the opening, including forming a substrate layer in the opening, wherein the substrate layer includes a dielectric material, and performing a treatment process on the substrate layer on a bottom surface of the opening, so that the substrate layer forms a rectify layer. The rectify layer includes a first portion and a second portion. The first portion is located on the bottom surface of the opening. The second portion is located on a sidewall of the opening. The first portion has more diffusion paths of metal ions than the second portion. A barrier layer is formed on the rectify layer. A metal filling layer is formed on the barrier layer of the opening. A memory device is formed on the dielectric layer.

The selector of the non-volatile memory according to an embodiment of the disclosure has a rectify layer as a current limiting device to avoid issues such as generation of a sneak current and SET disturb of a one-transistor and multi-resistance (1TnR) device.

In order to make the aforementioned features and advantages of the disclosure comprehensible, embodiments accompanied with drawings are described in detail below.

DESCRIPTION OF THE EMBODIMENTS

FIGS. 1A to 1F are schematic cross-sectional views showing a manufacturing process of a non-volatile memory according to an embodiment of the disclosure.

Figure 1A:
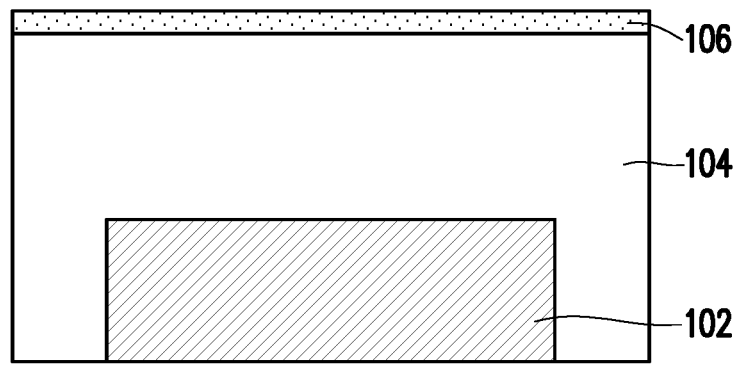
FIGS. 1A to 1F are schematic cross-sectional views showing a manufacturing process of a non-volatile memory according to an embodiment of the disclosure.

Referring to FIG. 1A, a dielectric layer 104 is formed on a conductor layer 102 such that the dielectric layer 104 covers the conductor layer 102. Next, a stop layer 106 is formed on the dielectric layer 104. The conductor layer 102 may be formed on a dielectric layer on a substrate. The conductor layer 102 is, for example, a first-layer metal layer of a metal interconnect. The material of the conductor layer 102 includes a metal and a metal alloy, such as copper, titanium, silver or an alloy of the foregoing.

The material of the dielectric layer 104 includes silicon oxide, silicon nitride, silicon oxynitride or other suitable insulating materials. The material of the stop layer 106 is different from the material of the dielectric layer 104. The stop layer 106 includes silicon oxide, silicon nitride, silicon oxynitride or other suitable materials that can serve as a polish stop layer or an etch stop layer.

Figure 1B:
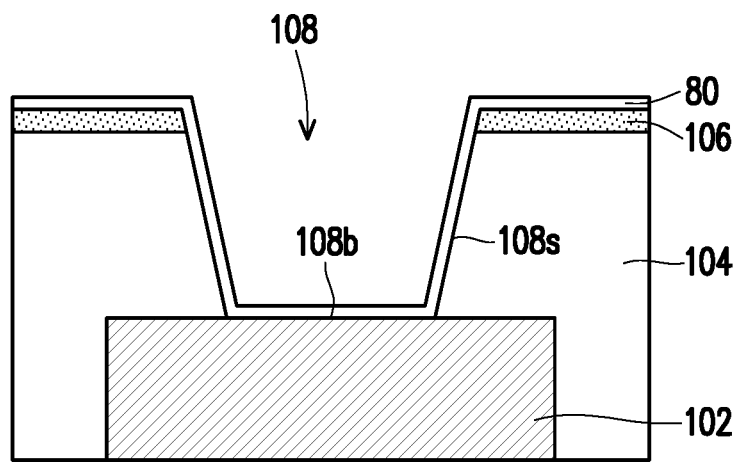

Next, referring to FIG. 1B, a lithography etching process is performed to form an opening 108 in the stop layer 106 and the dielectric layer 104. A bottom surface 108b of the opening 108 exposes a portion of the conductor layer 102.

After the opening 108 is formed, a substrate layer 80 is formed on the stop layer 106 and on a sidewall 108s and the bottom surface 108b of the opening 108. The substrate layer 80 may be a conformal layer. The substrate layer 80 includes a dielectric material layer. The dielectric material layer may be a high dielectric constant dielectric material having a dielectric constant of, for example, 3.9 or more. The dielectric material layer may be an oxide such as $TiO_2$, $Al_2O_3$, $HfO_2$ or a combination thereof. The thickness of the substrate layer 80 is, for example, 30 angstroms to 300 angstroms.

Figure 1C:
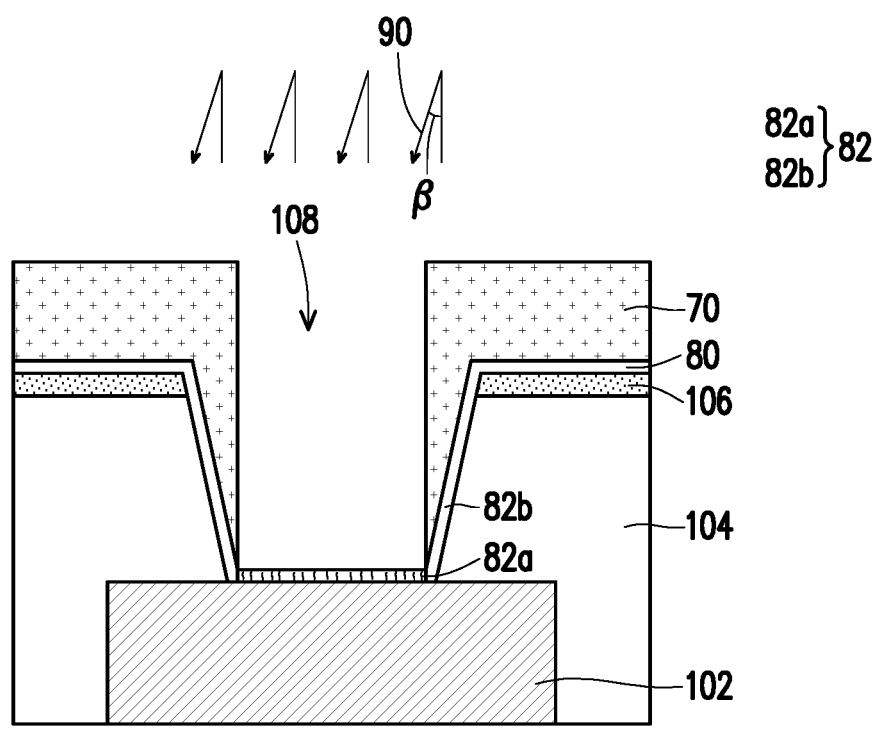

Thereafter, referring to FIG. 1C, a mask layer 70 is formed on the substrate layer 80, and a treatment process 90 is performed on the substrate layer 80 to form a rectify layer 82. The mask layer 70 covers the substrate layer 80 outside of the opening 108, so that the substrate layer 80 in the opening 108 is exposed. The mask layer 70 is, for example, a patterned photoresist layer.

The treatment process 90 is, for example, an ion implantation process to implant a dopant into the substrate layer 80 on the bottom surface 108b of the opening 108, so that it has a dopant to form a first portion 82a of the rectify layer 82. In an embodiment, the ion implantation process does not implant a dopant into the substrate layer 80 on the sidewall 108s of the opening 108, so it does not have a dopant, and the substrate layer 80 on the sidewall 108s of the opening 108 serves as a second portion 82b of the rectify layer 82. The first portion 82a has more structural defects than the second portion 82b and thus has more diffusion paths of metal ions. The dopant implanted in the ion implantation process is argon, nitrogen, boron, arsenic, phosphorus, indium, germanium or a combination thereof. The concentration of the dopant is, for example, $1E12$ ions/cm$^2$ to $1E16$ ions/cm$^2$. An angle $\beta$ between the implantation direction of the ion implantation process and the normal direction of the surface of the conductor layer 102 may be 0 degrees or less than 30 degrees. The energy of the ion implantation process is, for example, 0.1 KeV to 10 KeV.

Figure 1D:
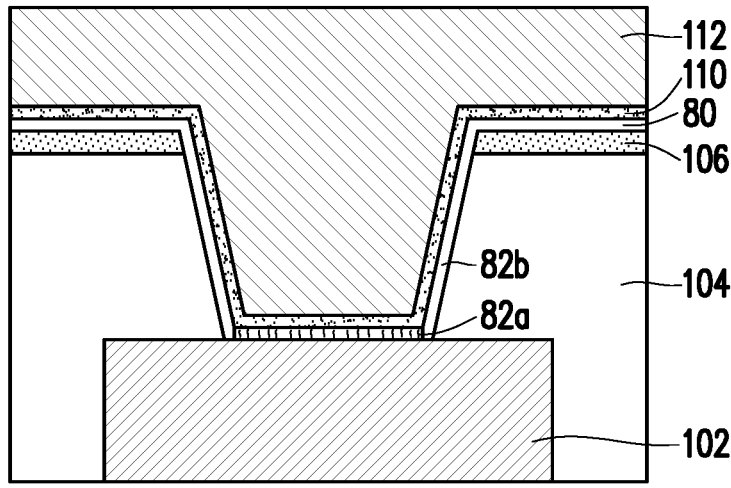
Figure 1E:
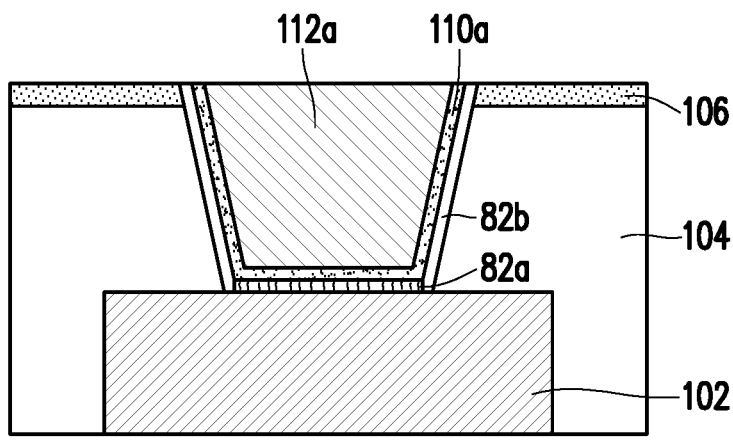

Referring to FIGS. 1C and 1D, the mask layer 70 is removed. Thereafter, a barrier layer 110 is formed on the substrate layer 80 and the rectify layer 82. The material of the barrier layer 110 may be tantalum, titanium, tantalum nitride, titanium nitride or other suitable materials. The thickness of the barrier layer 110 is, for example, 30 angstroms to 150 angstroms.

Thereafter, a metal filling layer 112 is formed on the barrier layer 110. The metal filling layer 112 may fill the opening 108. The metal filling layer 112 includes tungsten, copper or other suitable materials. Thereafter, referring to FIG. 1E, an etch back process or a planarization process is performed with the stop layer 106 as an etch stop layer or a polish stop layer to remove the metal filling layer 112, the barrier layer 110, and the substrate 80 on the stop layer 106. The metal filling layer 112a, the barrier layer 110a, and the rectify layer 82 remaining in the opening 108 together form a selector 120.

Figure 1F:
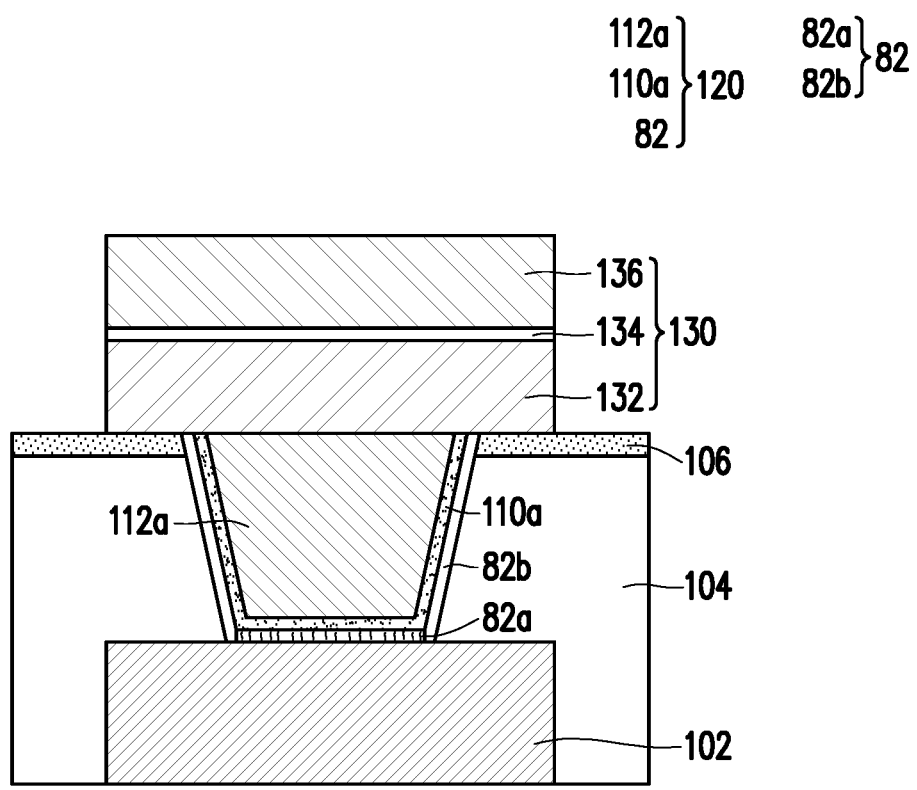

Referring to FIG. 1F, a memory device 130 is formed on the stop layer 106. In the embodiment, the memory device 130 is described as the RRAM 130. The RRAM 130 includes a metal-insulator-metal (MIM) structure formed by a first electrode 132, a second electrode 136, and a resistance changeable layer 134 interposed therebetween. The first electrode 132 is electrically connected to the selector 120. The materials of the first electrode 132 and the second electrode 136 are, for example, titanium nitride (TiN), platinum (Pt), iridium (Ir), ruthenium (Ru), titanium (Ti), tungsten (W), tantalum (Ta), aluminum (Al), zirconium (Zr), hafnium (Hf), nickel (Ni), copper (Cu), cobalt (Co), iron (Fe), gadolinium (Gd) or manganese (Mo). The resistance changeable layer 134 is disposed between the first electrode 132 and the second electrode 136. The resistance changeable layer 134 includes a dielectric material, such as hafnium oxide (such as HfO or $HfO_2$, etc.), lanthanum oxide, gadolinium oxide, yttrium oxide, zirconium oxide, titanium oxide, tantalum oxide, nickel oxide, tungsten oxide, copper oxide, cobalt oxide or iron oxide.

The selector 120 includes the metal filling layer 112a, the barrier layer 110, and the rectify layer 82. In an embodiment, top surfaces of the metal filling layer 112a, the barrier layer 110a, and the rectify layer 82 may be coplanar, but they are not limited thereto. The barrier layer 110a and the rectify layer 82 cover a sidewall and a bottom surface of the metal filling layer 112a. The barrier layer 110a and the rectify layer 82 may be conformal layers. The rectify layer 82 may serve as a current limiting device. The rectify layer 82 is a continuous layer that includes the first portion 82a and the second portion 82b. The first portion 82a of the rectify layer 82 is located on the bottom surface 108b of the opening 108 and is in physical contact with the conductor layer 102. The first portion 82a is located below the metal filling layer 112a and is sandwiched between and in physical contact with the barrier layer 110a and the conductor layer 102. The second portion 82b of the rectify layer 82 is located on the sidewall of the opening 108 and is in physical contact with the dielectric layer 104, the stop layer 106, and the first electrode 132. The second portion 82b is located between and in physical contact with the barrier layer 110a on the sidewall of the metal filling layer 112a and the dielectric layer 104.

In the above embodiment, the top surfaces of the metal filling layer 112a, the barrier layer 110a, and the rectify layer 82 of the selector 120 are coplanar. The top surfaces of the metal filling layer 112a, the barrier layer 110a, and the rectify layer 82 are all in physical contact with the first electrode 132 of the RRAM 130.

Figure 2A:
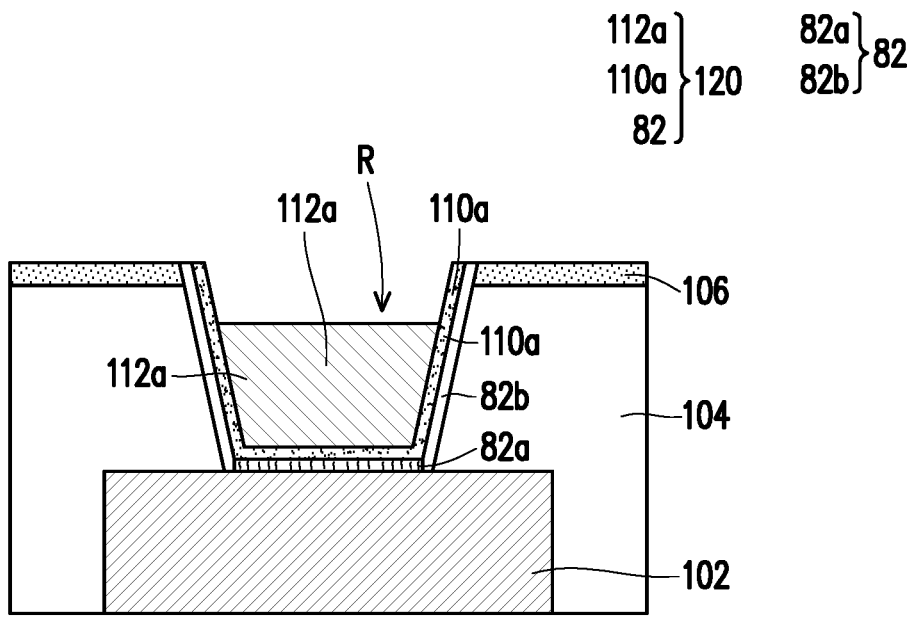
FIGS. 2A to 2B are schematic cross-sectional views showing a manufacturing process of a non-volatile memory according to another embodiment of the disclosure.
Figure 2B:
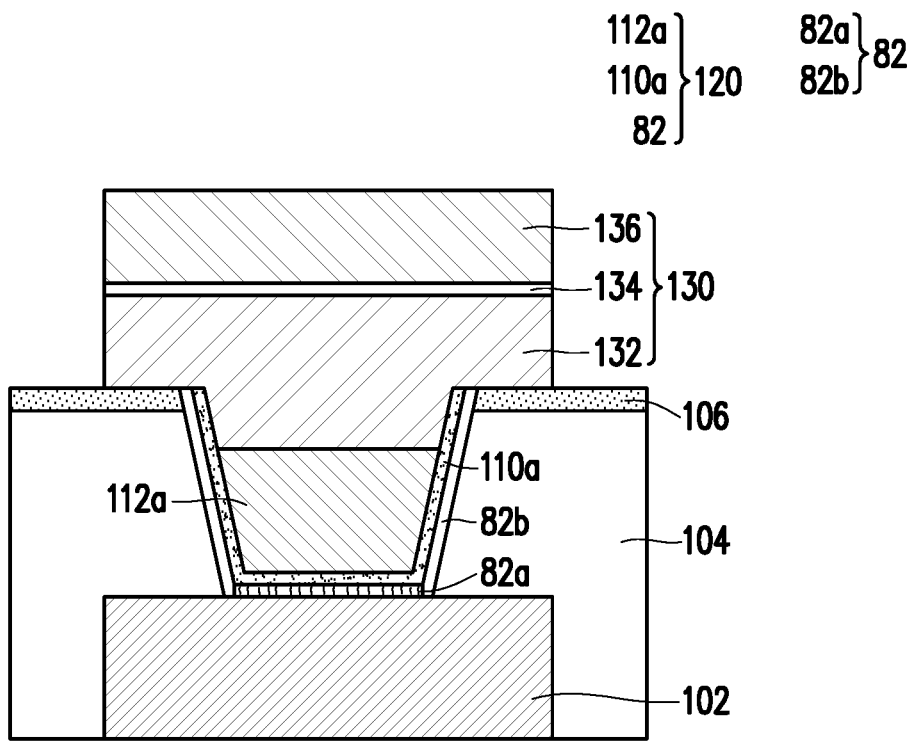

In another embodiment, the top surfaces of the metal filling layer, the barrier layer, and the rectify layer may not be coplanar. For example, referring to FIG. 2A, the selector is a plug disposed in the dielectric layer 104. The metal filling layer 112a, the barrier layer 110a, and the rectify layer 82 are all located in the dielectric layer 104. The top surface of the metal filling layer 112a is lower, and the rectify layer 82 and the barrier layer 110a may extend upward, so that their top surfaces protrude from the top surface of the metal filling layer 112a. A sidewall of the barrier layer 110a and the top surface of the metal filling layer 112a form a recess R. The first electrode 132 of the RRAM fills the recess R (as shown in FIG. 2B).

Figure 3A:
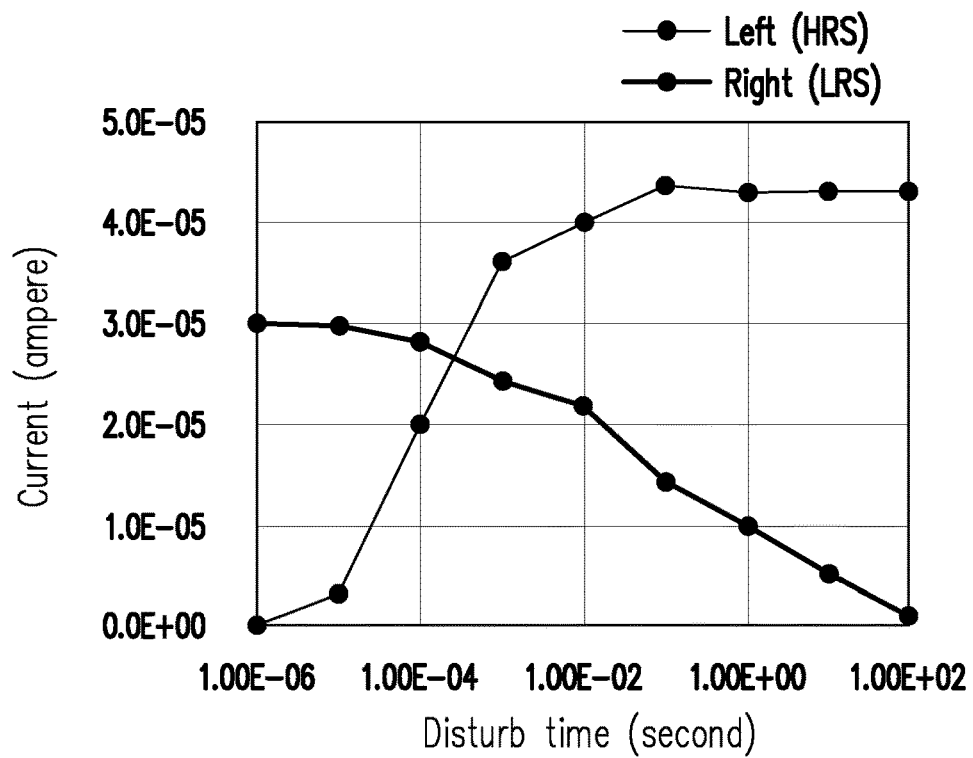
FIG. 3A is a graph showing electrical characteristics of a resistive random access memory without a selector of a comparative example.
Figure 3B:
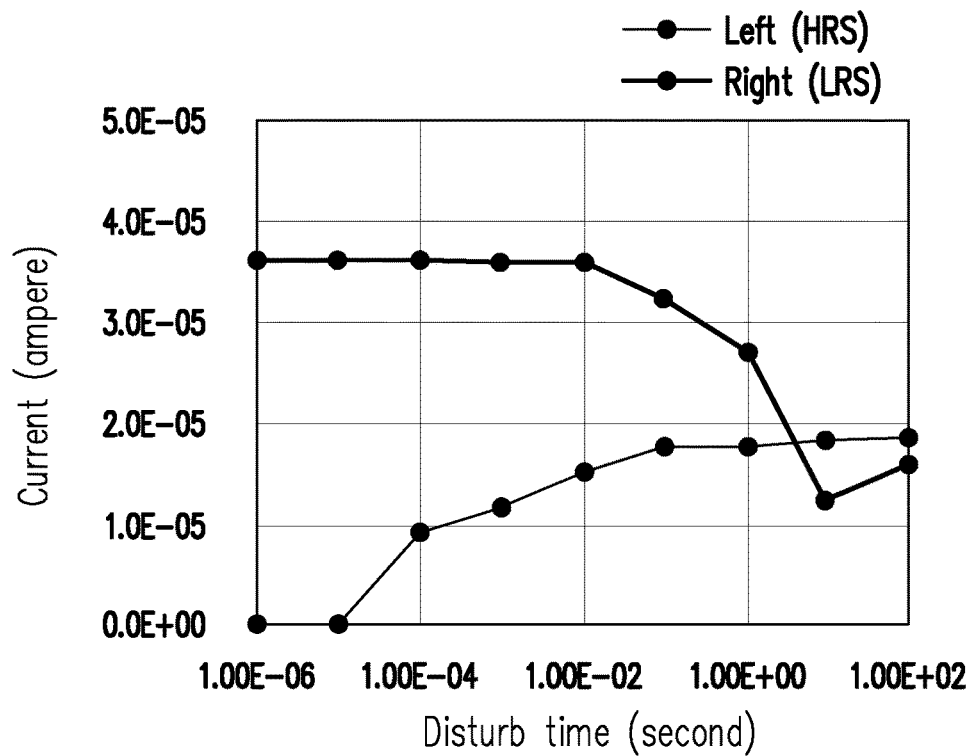
FIG. 3B is a graph showing electrical characteristics of a resistive random access memory with a selector of Example 1.
Figure 3C:
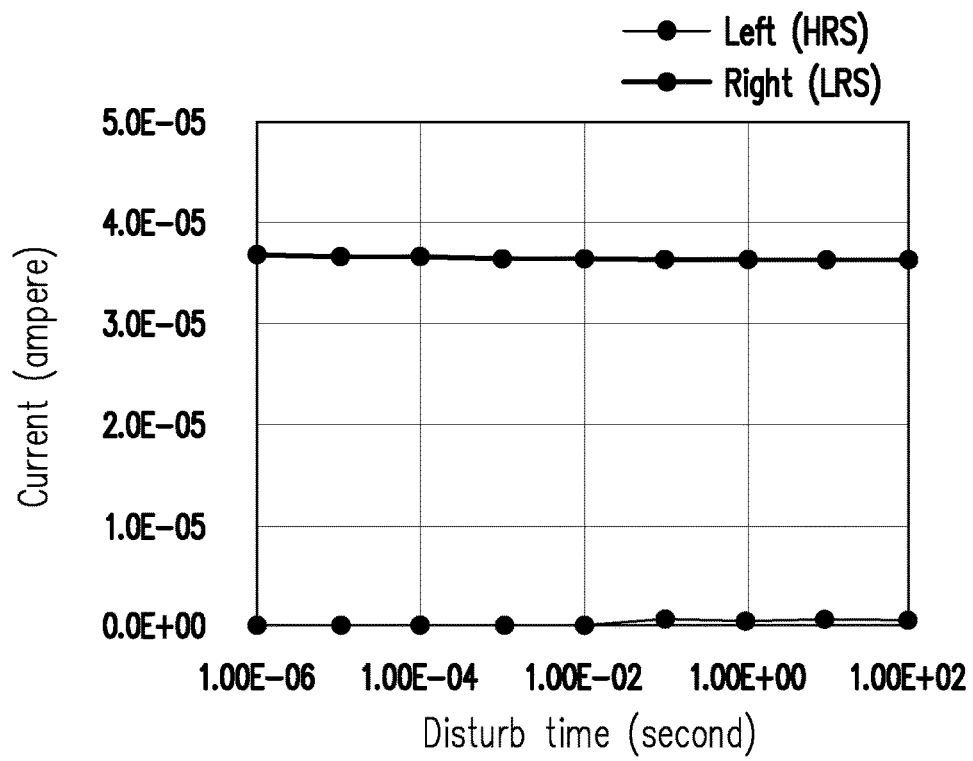
FIG. 3C is a graph showing electrical characteristics of a resistive random access memory with a selector of Example 2, wherein a rectify layer of the selector has a high dopant concentration.
Figure 3D:
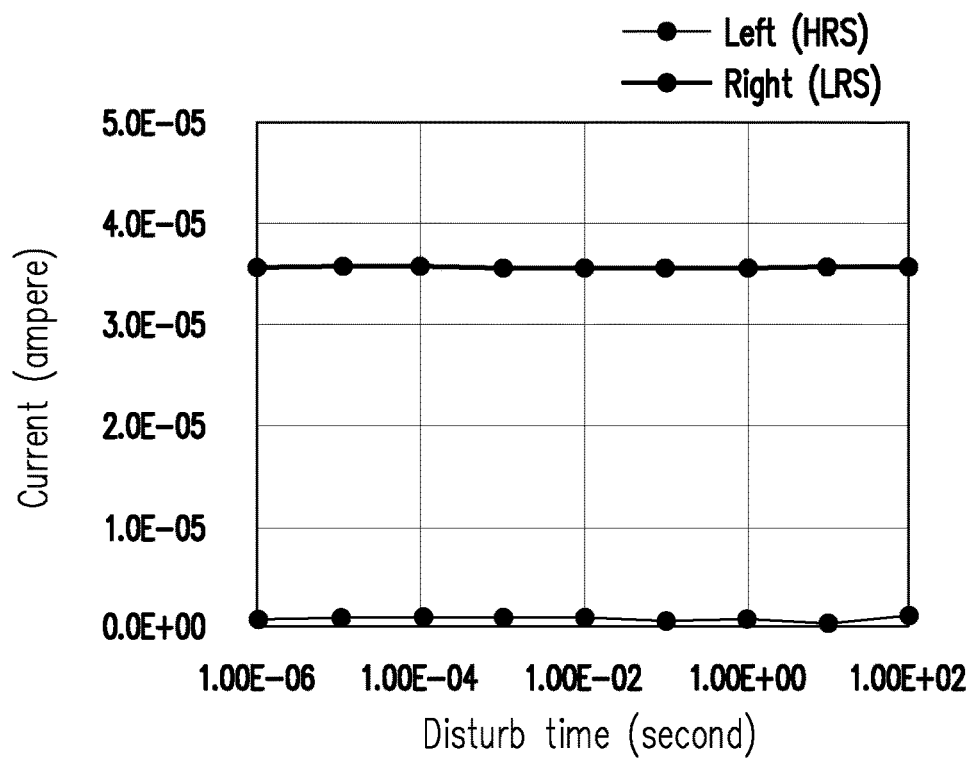
FIG. 3D is a graph showing electrical characteristics of a resistive random access memory with a selector of Example 3, wherein a rectify layer of the selector has a thicker thickness.

Comparing the results of FIGS. 3A and 3B, it is shown that the RRAM with the selector of the disclosure helps improving the issue of disturb compared with the RRAM without a selector. Comparing the results of FIGS. 2B, 3C and 3D, it is shown that when the rectify layer is formed by implanting a dopant into a substrate layer (such as a dielectric material) by an ion implantation process, the increase in the dopant concentration or the increase in the thickness of the rectify layer can further improve the disturb issue.

The selector of the non-volatile memory according to an embodiment of the disclosure has the rectify layer as a current limiting device to reduce the operating voltage of the selector. The selector according to an embodiment of the disclosure can avoid issues such as generation of a sneak current and SET disturb in a one-transistor and multi-resistance (1TnR) device.

What is claimed is:

1. A non-volatile memory, comprising:
a memory device;
a conductor layer located below the memory device;
a selector located between and electrically connected to the memory device and the conductive layer, the selector comprising:
a metal filling layer electrically connected to the memory device;
a barrier layer located on a sidewall and a bottom surface of the metal filling layer; and
a rectify layer wrapped around the barrier layer, the rectify layer comprising:
a first portion located between the barrier layer on the bottom surface of the metal filling layer and the conductive layer; and
a second portion, wherein the second portion and the metal filling layer sandwich the barrier layer on the sidewall of the metal filling layer,
wherein the first portion has more diffusion paths of metal ions than the second portion.

2. The non-volatile memory according to claim 1, wherein the rectify layer includes $TiO_2$, $Al_2O_3$, $HfO_2$ or a combination thereof.

3. The non-volatile memory according to claim 1, wherein the rectify layer includes a high dielectric constant dielectric material having a dielectric constant of 3.9 or more.

4. The non-volatile memory according to claim 1, wherein the first portion of the rectify layer has a dopant, and a dopant concentration of the first portion is higher than a dopant concentration of the second portion.

5. The non-volatile memory according to claim 4, wherein the dopant includes argon, nitrogen, boron, arsenic, phosphorus, indium, germanium or a combination thereof.

6. The non-volatile memory according to claim 1, wherein the first portion of the rectify layer has more structural defects than the second portion.

7. A method of fabricating a non-volatile memory, comprising:
forming a dielectric layer on a conductor layer;
forming an opening in the dielectric layer, and forming a selector in the opening, comprising:
forming a substrate layer in the opening, the substrate layer comprising a dielectric material;
performing a treatment process on the substrate layer on a bottom surface of the opening, so that the substrate layer forms a rectify layer, the rectify layer comprising:
a first portion located on the bottom surface of the opening; and
a second portion located on a sidewall of the opening, wherein the first portion has more diffusion paths of metal ions than the second portion;
forming a barrier layer on the rectify layer;
forming a metal filling layer on the barrier layer of the opening; and
forming a memory device on the dielectric layer.

8. The method of fabricating the non-volatile memory according to claim 7, wherein the treatment process includes an ion implantation process.

9. The method of fabricating the non-volatile memory according to claim 8, wherein a dopant implanted in the ion implantation process includes argon, nitrogen, boron, arsenic, phosphorus, indium, germanium or a combination thereof.

10. The method of fabricating the non-volatile memory according to claim 8, wherein an energy of the ion implantation process is 0.1 KeV to 10 KeV.

* * * * *